United States Patent [19]

Compton

[11] 4,168,997

[45] Sep. 25, 1979

[54] METHOD FOR MAKING INTEGRATED CIRCUIT TRANSISTORS WITH ISOLATION AND SUBSTRATE CONNECTED COLLECTORS UTILIZING SIMULTANEOUS OUTDIFFUSION TO CONVERT AN EPITAXIAL LAYER

[75] Inventor: James B. Compton, Los Gatos, Calif.

[73] Assignee: National Semiconductor Corporation, Santa Clara, Calif.

[21] Appl. No.: 949,832

[22] Filed: Oct. 10, 1978

[51] Int. Cl.$^2$ ..................... H01L 21/74; H01L 21/76; H01L 21/265

[52] U.S. Cl. ................................. 148/175; 29/576 B; 29/576 E; 29/576 W; 29/578; 148/1.5; 148/190; 148/191; 357/34; 357/40; 357/48; 29/577 C

[58] Field of Search ................ 148/1.5, 175, 190, 191; 29/576 B, 576 E, 576 W, 577, 578; 357/34, 40, 48

[56] References Cited

U.S. PATENT DOCUMENTS

| | | | |
|---|---|---|---|
| 3,481,801 | 12/1969 | Hugle | 148/175 |
| 3,560,277 | 2/1971 | Lloyd et al. | 148/191 X |
| 3,581,165 | 5/1971 | Seelbach et al. | 357/48 |
| 3,656,028 | 4/1972 | Langdon | 357/48 X |
| 3,737,347 | 6/1973 | Alcott et al. | 148/175 |
| 3,748,545 | 7/1973 | Beale | 148/191 X |
| 3,759,760 | 9/1973 | Encinas | 148/175 |
| 3,767,486 | 10/1973 | Imaizumi | 148/175 |
| 3,793,088 | 2/1974 | Eckton | 148/1.5 |
| 3,912,555 | 10/1975 | Tsuyuki | 148/175 |
| 4,046,605 | 9/1977 | Nelson et al. | 148/175 |

*Primary Examiner*—L. Dewayne Rutledge
*Assistant Examiner*—W. G. Saba
*Attorney, Agent, or Firm*—Gail W. Woodward

[57] ABSTRACT

In an integrated circuit structure a subsurface isolation layer is doped by diffusion during wafer processing. A substrate is first doped by ion implantation to create surface layer of the opposite conductivity type. Where substrate connections are to be created a heavier deposit of dopant is established using an impurity that will confer conductivity of the same polarity as the substrate. The wafer is then overgrown with an intrinsic layer that will be subsequently doped by diffusion of the ion implanted dopant. Then conventional integrated circuit processing is employed using buried conductive layers, epitaxy, isolation and device diffusion. The transistors thus produced can be designed to have isolation or substrate connected collectors as determined by the substrate surface doping.

6 Claims, 8 Drawing Figures

METHOD FOR MAKING INTEGRATED CIRCUIT TRANSISTORS WITH ISOLATION AND SUBSTRATE CONNECTED COLLECTORS UTILIZING SIMULTANEOUS OUTDIFFUSION TO CONVERT AN EPITAXIAL LAYER

BACKGROUND OF THE INVENTION

The invention relates to monolithic integrated circuit (IC) devices in which provision is made for either isolating or connecting vertically arrayed transistors to the IC substrate. This is ordinarily done using a heavily doped substrate wafer that is overcoated with an epitaxial isolation layer of the opposite conductivity type. A second epitaxial layer on top of the first, and of opposite conductivity type thereto, is employed as the material is which conventional double diffused transistors and other components are created. Conventional isolation diffusion and buried layers are also employed. For those transistors destined to be electrically connected to the substrate a buried layer extending completely through the epitaxial isolation layer is employed. This structure and the method for making it are disclosed in U.S. Pat. No. 4,046,605 to Carl T. Nelson and Brian E. Hollins. This patent further discloses a buried layer located so as to span the isolation layer in those regions where the IC is to be scribed and fractured into individual circuit chips.

SUMMARY OF THE INVENTION

It is an object of the invention to provide an improved process for fabricating ICs in which a subsurface isolation layer is spanned in selected areas by an opposite conductivity buried layer.

It is further object of the invention to use ion implantation and diffusion to dope a subsurface isolation layer and buried layers located in areas where the isolation layer is to be spanned.

These and other objects are achieved in the following process. A heavily doped or n+ wafer is employed as a substrate. First an implantation mask is applied to the wafer surface so as to expose the substrate in those regions where a subsequently established isolation layer is to be spanned. Phosphorus is then ion implanted into the exposed surface regions. The mask is then removed and boron ions implanted over the entire wafer surface to about half of the phosphorus dosage. Then a substantially intrinsic or undoped epitaxial layer is grown over the wafer. At this point the wafer is subsequently treated as if it were a conventional p type substrate employed in IC fabrication. First, n+ type buried layer doping is established and the wafer overcoated with an n type epitaxial layer. Then isolation diffusion is employed as is conventional. At this stage of fabrication the previously ion implanted dopants will have diffused into the intrinsic epitaxial layer. The boron will act to dope the layer p type thus creating a subsurface isolation layer on top of the n+ substrate. The phosphorus will up diffuse to contact the conventional buried layers in those areas where the subsurface isolation layer is to be spanned. In those regions the heavier n type ion implanted phosphrous will overpower the boron and contact the buried layer on top of the first epitaxial layer which will have diffused downward to meet the upward diffusion. This spanning action can then be used to provide electrical contact to the substrate or to provide p-n junction termination of the subsurface isolation layer where desired.

The structure is completed by conventional double diffusion to create transistors, diodes and resistors in the uppermost epitaxial layer followed by contacting and metallization.

DESCRIPTION OF THE PRIOR ART

Figure 1:
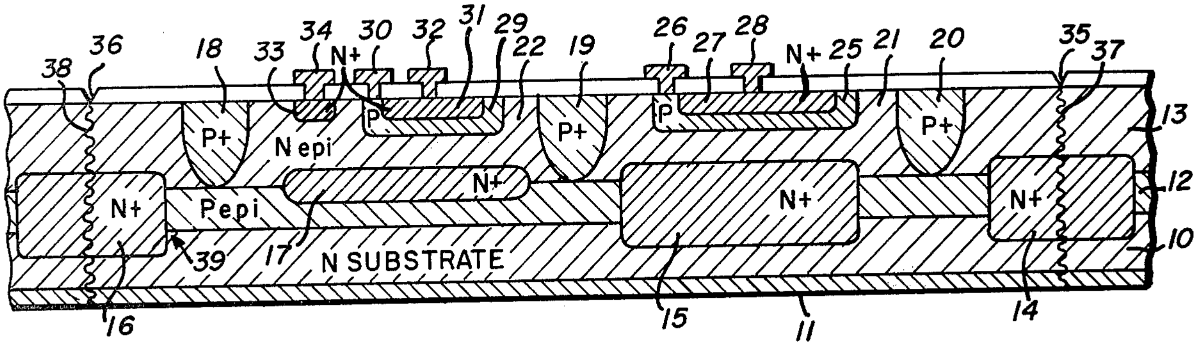
Fig 1 (PRIOR ART)
FIG. 1 shows a cross section of the structure achieved by the process of the prior art.

FIG. 1 shows the structure disclosed in U.S. Pat. No. 4,046,605. An n type substrate wafer 10 has an ohmic backside contact 11. Substrate 10 has a p type deposited epitaxial layer 12 located thereon and layer 12 is overcoated with an n type epitaxial layer 13. These two layers are epitaxed and accurately doped to provide the desired resistivity values. Prior to depositing layer 12, heavily doped n type inserts are established at regions 14, 15, and 16. Then, prior to depositing layer 13, heavily doped n type inserts are located in regions 14, 15, 16 and 17. Isolation diffusions are then applied to create regions 18, 19, and 20 which extend completely through layer 13 and act to isolate portions of layer 13 by p-n junction means. During wafer processing the inserts at regions 14, 15, and 16 expand to merge, thus causing them to span layer 12.

In practice isolation diffusions 19 and 20 are surface contoured to ring a portion of layer 13 so as to isolate an n type tub 21 located over region 15. Isolation diffusions 18 and 19 are surface contoured to ring a second portion of layer 13 so as to isolate a second n type tub 22 located over region 17.

Conventional n+ type emitter and p type base diffusions are applied to tubs 21 and 22 to create conventional n p n IC transistors. For example, p type region 25 and ohmic contact 26 form a base electrode with n+ type region 27 and ohmic contact 28 forming an associated emitter. Tub 21 constitutes the collector with its associated ohmic contact to region 15 electrically connecting the collector to substrate 10 and backside contact 11. Thus, whenever a transistor is to be fabricated into an IC with its collector substrate connected, the structure over region 15 is employed.

When a transistor with a collector isolated from the substrate is to be employed, the tub 22 form is used. Here p type region 29 and the ohmic contact 30 form the base electrode. N+ region 31 and its ohmic contact 32 form the emitter electrode. N+ region 33 and ohmic contact 34 form the topside isolated collector electrode. Buried region 17 provides the conventional low collector resistance structure.

Regions 14 and 16 are configured to form frames that completely ring an individual circuit in the IC wafer. This means that when the IC wafer is scribed at locations 35 and 36 and fractured along lines 37 and 38, the fracture lines pass through regions 14 and 16. It can be seen that region 16 terminates layer 12 at 39 by forming a p n junction therewith. Thus, the fracturing employed in circuit separation passes only through n type material and therefore does not create any potentially high leakage junctions.

In order to create reliable circuits it is necessary that regions 14, 15, and 16 completely span layer 12 and this necessitates buried layers under layers 12 and 13 that are expanded by diffusion until their diffusion fronts merge sufficiently to overcome the background doping in layer 12. The doping in layer 12 is selected to give the desired isolation junction breakdown voltage for the IC. Thus, it can be seen that the buried layers that form regions 14, 15, and 16 must be very heavily doped and diffused sufficiently to completely overcompensate the central portion of layer 12. This has proven to be a difficult requirement in a mass production process.

DESCRIPTION OF THE INVENTION

FIGS. 2–8 detail the steps for fabricating the structure of FIG. 1 in accordance with the invention. While n p n transistor fabrication is to be described it is to be understood that p n p devices could be incorporated into the wafer being processed. Also, the conductivity types shown could all be complemented to produce a working structure. The drawing is confined to a small portion of a wafer in which a plurality of IC structures are being simultaneously fabricated. The drawing is not to scale but is dimensionally exaggerated to better illustrate the various layers involved in practicing the invention. Conventional IC processing is contemplated in the form well-known in the semiconductor industry. Only those processes critically involved in the invention will be described in detail.

Figure 2:
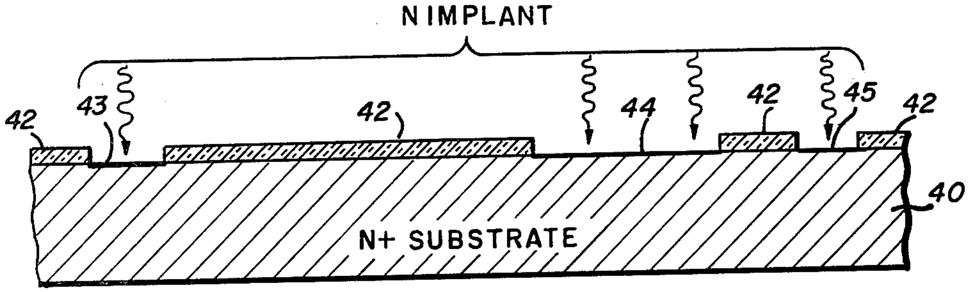
FIGS. 2 through 8 illustrate in cross section the various steps in the process of the invention.

With reference to FIG. 2 a heavily doped n type substrate wafer 40 is the starting material. Desirably, the silicon wafer 40 is doped to a level of about $10^{17}$ atoms/cc of an n type dopant, preferably a slow diffusing material such as antimony.

Figure 3:
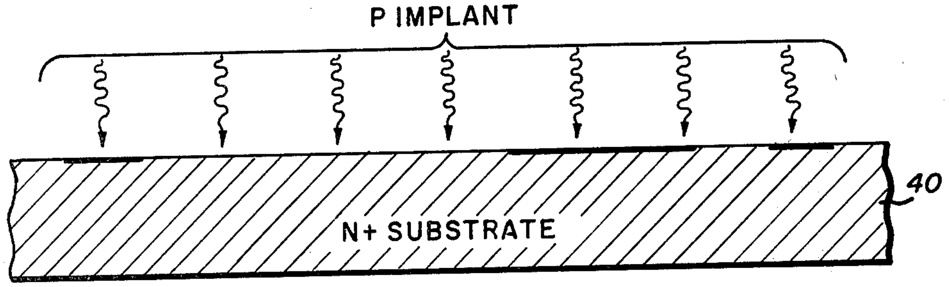

A shown in FIG. 2, wafer 40, is provided with a mask 42 which is shown as having three openings 43–45 produced therein by photolithographic techniques. An n type impurity such as phosphorus is then ion implanted to a surface dosage of about $10^{14}$ atoms/cm$^2$. Then mask 42 is removed and an impurity such as boron deposited over the wafer surface as shown in FIG. 3. The boron is controlled to have a concentration about one half that of the previously applied phosphorus. Thus where the phosphorus was implanted, it will overpower the boron. Since both boron and phosphorus diffuse at approximately the same rate the phosphorus region will remain n type.

At this point, one of the critical features of the invention is present. Ion implantation is an important tool. The surface dosage can be metered relatively accurately and more importantly the n and p type impurity ratio can be nicely implemented. A conventional diffusion or pre-deposit, while useful, cannot be relied upon to give as close control as is necessary in the concentration range required to permit epitaxial growth over the doped areas.

Figure 4:
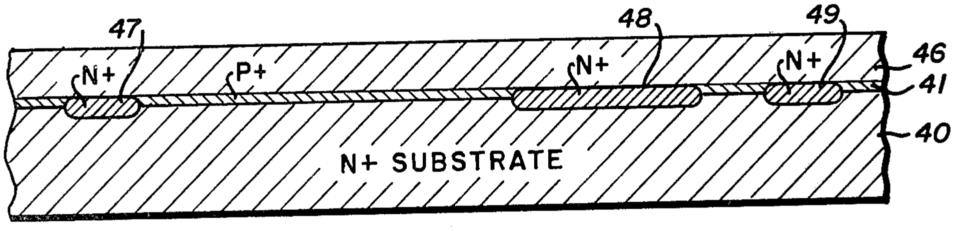

After the surface doping is achieved the surface of the wafer is carefully cleaned so as to avoid disturbing the ion implanted impurities. Then epitaxial layer 46 is grown as illustrated in FIG. 4. Epitaxial layer 46 is grown to a thickness of about 15 microns and is desirably undoped. This layer can have a small residual doping of either p or n type or it can be truly intrinsic. In practice the layer is simply grown without any deliberate doping and no resistivity specification is imposed. As a matter of practice such undoped layers will generally have a resistivity in excess of 10 ohm cm and are generally n type. As shown in FIG. 4 the n type dopant deposited inside windows 43–45 of FIG. 2 will tend to diffuse during epitaxy to create n+ regions 47, 48, and 49. The surface doping from the original boron implant will diffuse and expand to create a p type region 41. However, since the boron is overpowered by the excess phosphorus, regions 47–49 will still be relatively heavily doped n type.

Figure 5:
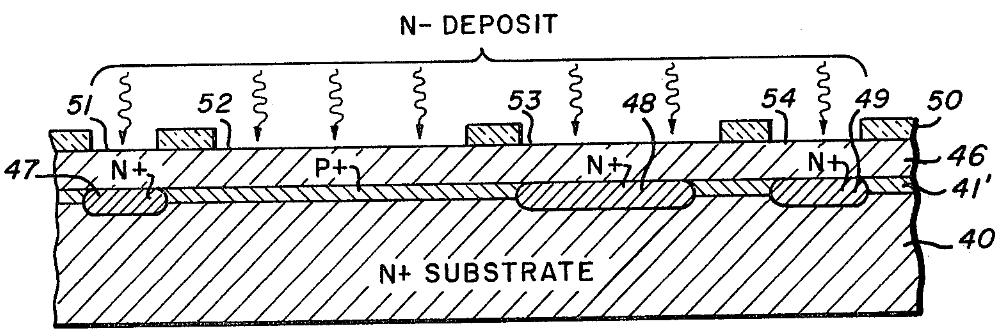
Figure 6:
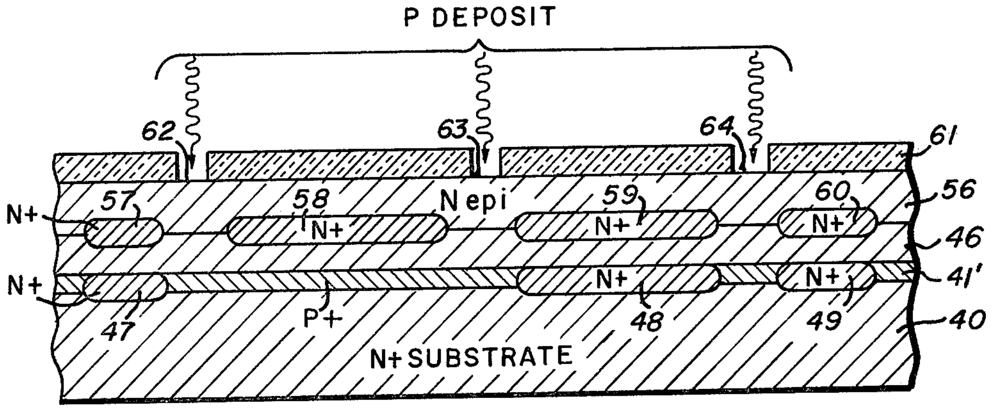

As shown in FIG. 5 a mask 50 is then located on top of epitaxial layer 46. This will typically be on oxide mask having holes 51, 52, 53, and 54 photolithographically etched therein. The wafer is then subjected to an n type dopant such as arsenic or antimony in the conventional diffusion predeposition. Alternatively, this n type deposit can also be ion implanted as described above. After the n type doping is completed the masking is stripped off, the wafer cleaned and a second epitaxial layer deposited thereon. This layer is desirably about 15 microns thick or as required for the transistor breakdown voltage desired and of an n type resistivity, typically of about 2 ohm cm. As shown in FIG. 6, n type epitaxial layer 56 is located on top of epitaxial layer 46. The n typed doped regions 57–60 result from the doping through windows 51–54 in mask 50 of FIG. 5.

Figure 7:
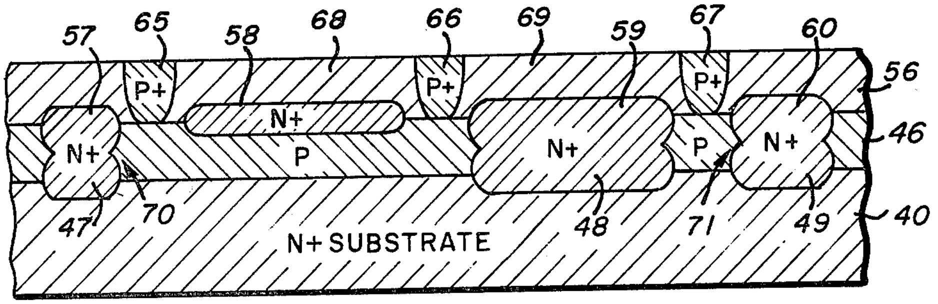

Further, as shown in FIG. 6, a mask 61 is located on top of epitaxial layer 56 and windows 62–64 photolithographically etched therein. A p type diffusant such as boron is then deposited as is conventional in IC isolation diffusion. After deposition the wafer is subjected to a drive in cycle to cause the boron to completely penetrate layer 56. FIG. 7 shows the structure after isolation drive in and with the isolation mask stripped off.

In FIG. 7 it will be noted that layer 41' (of FIG. 6) has expanded to completely dope epitaxial layer 46 p type. Regions 47 and 57 have expanded so as to merge into a single n type buried region. Regions 48 and 59 have merged as have regions 49 and 60. Region 58, having no underlying counterpart, is still facing a p type doped portion of epitaxial layer 46.

The surface topography of the isolation diffusion shown in section at 65 and 66 has been contoured, as described above, to form a ring around region 58. Thus, an epitaxial n type tub 68 is p n junction insolated from the rest of the IC and provided with a conductive buried region 58.

The surface topography of the isolation diffusion shown in section at 66 and 67 has been contoured, as described above, to form a ring around region 59. Thus, an epitaxial n type tub 69 is coupled via regions 59 and 48 to substrate 40.

The surface topography of the regions 57 and 60 (with associated regions 47 and 49) are contoured to form a frame that encloses a complete IC. Thus, as can be seen at 70 and 71, p type layer 46 is subsurface terminated by a p n junction.

Figure 8:
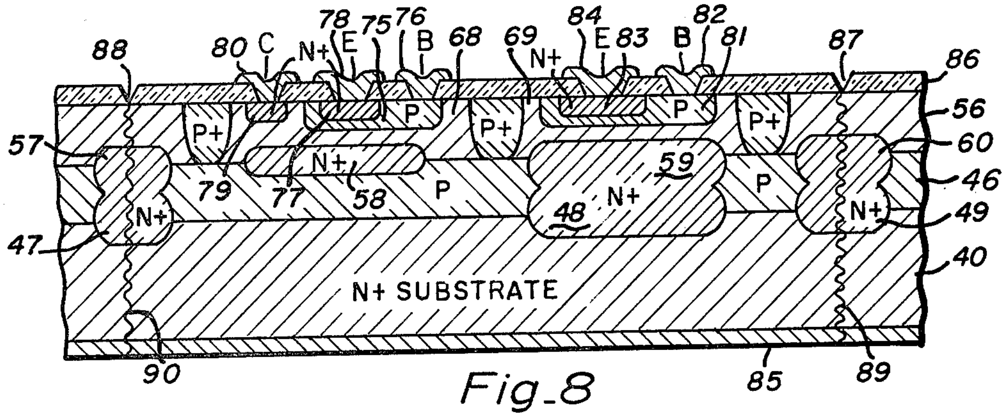

FIG. 8 shows the structure with transistors located therein. Tub 68 has a p type base 75 diffused therein and base contact 76 is provided. An n+ emitter 77 is diffused into base 75 and metal 78 provides an ohmic emitter electrode. An n+ diffusion 79 with ohmic metal 80 provides a collector electrode. This strucure forms an isolated n p n transistor.

Tub 69 has a transistor p type base 81 diffused therein and ohmic metal 82 completes base electrode. Emitter 83 is diffused into base 81 and metal 84 is the ohmic emitter electrode. Regions 59 and 48 connect the collector of this transistor to substrate 40.

The substrate 40 has been provided with a conductive metal backside contact 85. The upper surface has the conventional planar passivating oxide 86 located thereon. Scribe lines 87 and 88 are located over the buried n+ frame so that the resulting fracture lines 89 and 90 are confined entirely to n type material and do not intersect any active p n junctions.

From the above it is clear that any of the n p n transistors can be isolated or substrate connected as desired. This is determined by the mask openings illustrated in FIG. 2. Opening 44 ultimately resulted in a substrate connected transistor. If this transistor were desired to be isolated, the window 44 would be omitted. This gives the IC designer a significant degree of freedom. Where a substrate connection is desired the designer can invoke it using a very lowresistance, reliable, non-metallic connection.

An additional substantial advantage in using this assembly process lies in the nature of layer 46. Since layer 46 is deposited intrinsically and doped from layer 41 of FIG. 4, its resistivity grades from low adjacent to substrate 40 to high adjacent to layer 56. This means that where the n+ buried layers merge to make connections to the substrate the resistivity of layer 46 is relatively high. Thus, the n type dopants can more easily overpower the p type background and a very reliable merged contact is produced.

The process of the invention has been described and several alternatives set forth. It is clear that a person skilled in the art will perceive still other alternatives and equivalents within the spirit and intent of the invention. Accordingly, it is intended that the scope of the invention be limited only by the claims that follow.

I claim:

1. A semiconductor integrated circuit process comprising the steps:

providing a semiconductor substrate wafer having one conductivity type;

ion implanting a first impurity of said one conductivity type into a first group of selected regions of the surface of said substrate wafer;

ion implanting a second impurity into said surface of said substrate wafer, said second impurity being of material capable of doping said semiconductor to a conductivity type opposite to said one conductivity type and in a concentration substantially lower than that of said first impurity said first and second impurities having a higher diffusion coefficient than the substrate impurity;

growing a first substantially intrinsic epitaxial layer of semiconductor on said substrate wafer;

depositing a third impurity into the surface of said first epitaxial layer in a second group of selected regions, said third impurity being capable of imparting said one conductivity type to said semiconductor, said second group of selected regions including regions in registry with said first group of selected regions;

growing a second epitaxial layer of semiconductor on said first epitaxial layer, said second epitaxial layer having said one conductivity type; and forming isolation diffusions in said second epitaxial layer using an impurity that is capable of imparting said second conductivity type to said semiconductor and extending completely through said second epitaxial layer, whereby said diffusion causes said second impurity to dope said first epitaxial layer and causes said first and third impurities to dope said first epitaxial layer so that said first and third impurities span said first epitaxial layer in said first group of selected regions.

2. The process of claim 1 wherein said first group of selected regions includes those regions intended to accommodate substrate connected transistors in said integrated circuit and those regions intended to lie under wafer scribe lines.

3. The process of claim 2 wherein said one conductivity type is n type, said second impurity is boron, and said first and third impurities are phosphorus.

4. In the process of fabricating a subsurface isolation layer in an integrated circuit wherein said isolation layer is spanned in selected regions by buried layers, the steps comprising:

ion implanting a first conductivity type impurity into said selected regions of the surface of a semiconductor substrate of said first type impurity;

ion implanting a second impurity of opposite conductivity type into the surface of said semiconductor substrate said first and second impurities having a higher diffusion coefficient than the substrate impurity and wherein the nature and amount of said first impurity are selected to produce a greater concentration in the semiconductor than said second impurity;

growing a substantially intrinsic epitaxial layer of semiconductor over the surface of said semiconductor substrate; and processing said semiconductor substrate to diffuse said second impurity through said epitaxial layer to determine the conductivity type thereof and to diffuse said first impurity through said epitaxial layer to determine the conductivity thereof above said selected regions.

5. The process of claim 4 wherein said layer is grown without deliberate impurity doping.

6. The process of claim 5 wherein said semiconductor is silicon, said first impurity is phosphorus, and said second impurity is boron.

* * * * *